United States Patent
Agmon

(10) Patent No.: US 7,231,619 B1
(45) Date of Patent: *Jun. 12, 2007

(54) EXTENDED MODEL CHECKING HARDWARE VERIFICATION

(75) Inventor: Nimrod Agmon, Givat Chaim Meucad (IL)

(73) Assignee: Marvell Semiconductor Israel Ltd., Yokneam (IL)

( * ) Notice: Subject to any disclaimer, the term of this patent is extended or adjusted under 35 U.S.C. 154(b) by 313 days.

This patent is subject to a terminal disclaimer.

(21) Appl. No.: 10/790,688

(22) Filed: Mar. 3, 2004

(51) Int. Cl.
  *G06F 17/50* (2006.01)
  *G06F 9/45* (2006.01)
(52) U.S. Cl. ............................... 716/5; 716/4
(58) Field of Classification Search ............... 716/4, 716/5
  See application file for complete search history.

(56) References Cited

U.S. PATENT DOCUMENTS

| | | | |
|---|---|---|---|
| 6,247,164 B1 | 6/2001 | Ashar et al. | |
| 6,496,961 B2 | 12/2002 | Gupta et al. | |
| 6,553,514 B1* | 4/2003 | Baumgartner et al. | 714/32 |
| 6,560,758 B1* | 5/2003 | Jain | 716/7 |
| 6,571,375 B1* | 5/2003 | Narain et al. | 716/5 |
| 6,665,848 B2* | 12/2003 | Ben-David et al. | 716/5 |
| 6,691,078 B1* | 2/2004 | Beer et al. | 703/14 |
| 6,698,003 B2* | 2/2004 | Baumgartner et al. | 716/4 |
| 6,735,743 B1* | 5/2004 | McElvain | 716/4 |
| 6,816,827 B1* | 11/2004 | Xia et al. | 703/15 |
| 6,944,838 B2* | 9/2005 | McMillan | 716/5 |
| 7,020,856 B2* | 3/2006 | Singhal et al. | 716/4 |
| 2002/0046391 A1* | 4/2002 | Ito et al. | 716/18 |
| 2002/0123867 A1 | 9/2002 | Shtrichman | |
| 2002/0138812 A1 | 9/2002 | Johannsen | |
| 2004/0117746 A1* | 6/2004 | Narain et al. | 716/4 |
| 2005/0034090 A1* | 2/2005 | Sato et al. | 716/6 |

* cited by examiner

*Primary Examiner*—Jack Chiang
*Assistant Examiner*—Magid Y. Dimyan

(57) ABSTRACT

A method and computer program for testing a design of a circuit comprises providing a model of the design; providing a first property for the design, wherein the first property describes a first behavior; checking the model using the first property and an environment of the design at a reset state until an example of the first behavior occurs; providing a second property for the design, wherein the second property describes a second behavior; and checking the model using the second property and an environment of the design at a state when the example of the first behavior occurs.

14 Claims, 2 Drawing Sheets

EXTENDED MODEL CHECKING HARDWARE VERIFICATION

BACKGROUND

The present invention relates generally to hardware verification for electronic circuit designs. More particularly, the present invention relates to model checking and bounded model checking techniques for such verification.

Recent advances in the design of application specific integrated circuits (ASIC) and system-on-chip (SoC) circuits are producing circuit designs of rapidly increasing complexity. These designs are driving the search for techniques that are capable of verifying such complex designs.

Two commonly-used verification techniques are simulation and formal verification. Simulation involves driving test vectors into a physical realization of the design and monitoring the response. However, because the number of test vectors required for complete coverage rises exponentially with the number of input bits and state bits (flip-flops) in the design, simulation can explore only a very small portion of the state space of a design. For example, a design that has only 40 input bits and 40 state bits would require billions of years of simulation time for complete coverage.

In contrast, model checking employs exhaustive mathematical techniques to prove whether a property holds true for a given design. A model checker uses a model of the design to consider all possible input combinations, and covers all possible reachable states to verify the property. This is possible due to efficient techniques such as Boolean satisfiability engines used in model checkers that allow analysis of sets of states simultaneously, and only consider the logic in the cone of influence of the property the tool is verifying. A bounded model checker, like any model checker, employs exhaustive mathematical techniques to prove whether a property holds true for a given design, but only until some certain cycle k.

SUMMARY

In general, in one aspect, the invention features a method and computer program for testing a design of a circuit. It comprises providing a model of the design; providing a first property for the design, wherein the first property describes a first behavior; checking the model using the first property and an environment of the design at a reset state until an example of the first behavior occurs; providing a second property for the design, wherein the second property describes a second behavior; and checking the model using the second property and an environment of the design at a state when the example of the first behavior occurs.

Particular implementations can include one or more of the following features. Providing the first property comprises providing a Boolean expression representing a formula that the first behavior does not occur, wherein the Boolean expression comprises a plurality of Boolean variables. Checking the model using the first property comprises determining a set of values for the Boolean variables of the Boolean expression that causes the Boolean expression to be false. Implementations comprise providing the environment of the design at the reset state. Implementations comprise providing the environment of the design at a state when the example of the first behavior occurs. Providing the environment of the design at the state when the example of the first behavior occurs comprises at least one of the group consisting of describing the state when the example of the first behavior occurs; and providing the values of the Boolean variables of the Boolean expression.

The details of one or more implementations are set forth in the accompanying drawings and the description below. Other features will be apparent from the description and drawings, and from the claims.

Figure 1A:
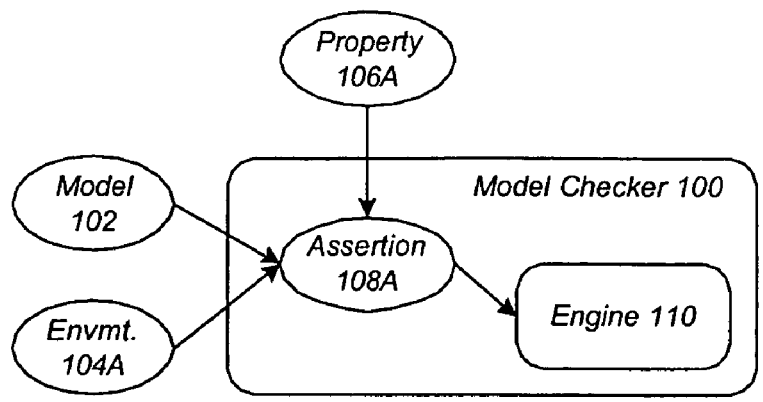
FIGS. 1A, 1B, and 1C show a functional block diagram of a model checker according to a preferred embodiment of the present invention.

The leading digit(s) of each reference numeral used in this specification indicates the number of the drawing in which the reference numeral first appears.

DETAILED DESCRIPTION

Formal verification is a name for a variety of methods for proving the correctness of electronic circuit designs. Given a formal description of a design, and a formal specification of its desired behavior, formal verification methods can be used to mathematically prove that the design complies with its specification. For example, formal verification can be used to prove that a cache control unit complies with specified cache coherency rules.

One family of formal verification tools is referred to as model checkers. A model checker is a software program that checks whether a model of the design satisfies a logical specification of the design. A bounded model checker is a software program that checks whether a model of the design satisfies a logical specification of the design until some certain cycle k.

However, conventional model checkers are limited by the size of design that they can explore in a reasonable amount of time and using reasonable memory. Bounded model checkers are limited by the number of cycles of a design that can be checked in a reasonable amount of time. With each cycle, the logic cone checked grows exponentially, as does the computer time required by the model checker, reaching days and weeks after only a few tens of cycles. Further, conventional model checkers always begin model checking with the reset state of the design. Therefore many states of the design cannot be reached with conventional model checkers.

According to embodiments of the present invention, a model checker is used to begin model checking with states other than the reset state of the design. Embodiments of the present invention also use model checkers to locate examples of interesting behavior of the design, which can then be used as starting points for model checking.

Figure 1B:
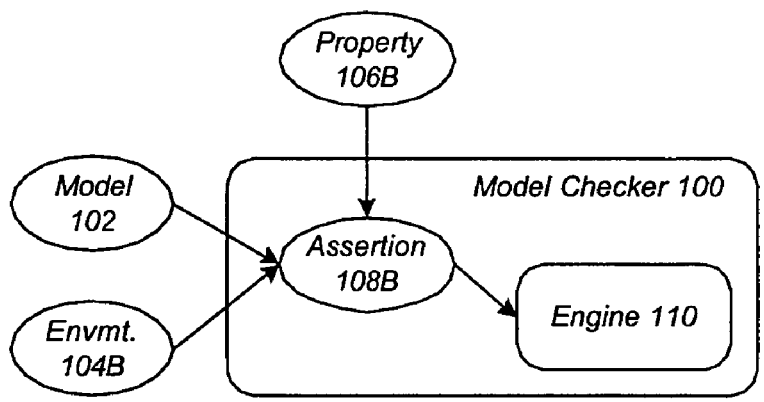
Figure 1C:
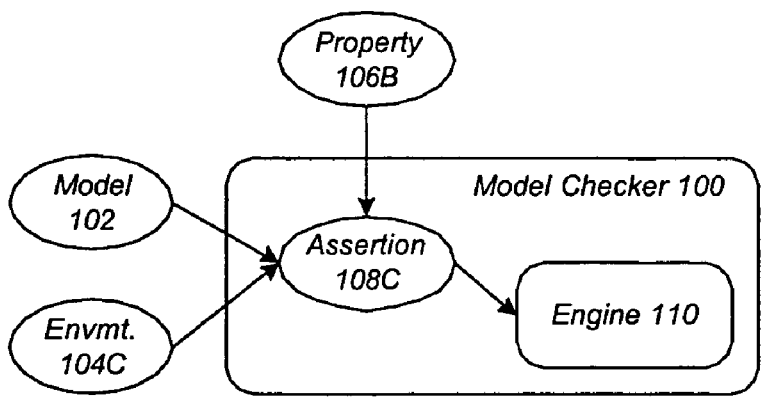

FIGS. 1A, 1B, and 1C show functional block diagrams of a model checker 100 according to a preferred embodiment of the present invention. Model checker 100 can be obtained as commercially-available software. Model checker 100 receives a model 102 of the design, an environment 104 for the design, which can be provided separately or as part of model 102, and a property 106.

Design model 102 is a description of the design, and is preferably provided as a register-transfer-level (RTL) specification, although other descriptions can be used. Environment 104 describes the environment in which the design is intended to perform, including for example predetermined signals such as reset signals, clock signals, and the like.

Property 106 is a description of one or more intended behaviors of the design. For example, a property 106 can specify that a buffer never fills. Properties 106 are conventionally derived from the design specification. Property 106 is preferably provided in a language such as Property Specification Language (PSL), Sugar, or the like.

Model checker 100 generates a formula 108 based on model 102, environment 104, and property 106. Formula 108 is preferably generated as a Boolean expression comprising a plurality of Boolean variables, although other expressions can be used.

Model checker 100 comprises an engine 110 that solves formula 108. Preferably engine 110 is a Boolean satisfiability engine, although other engines can be used.

Figure 2:
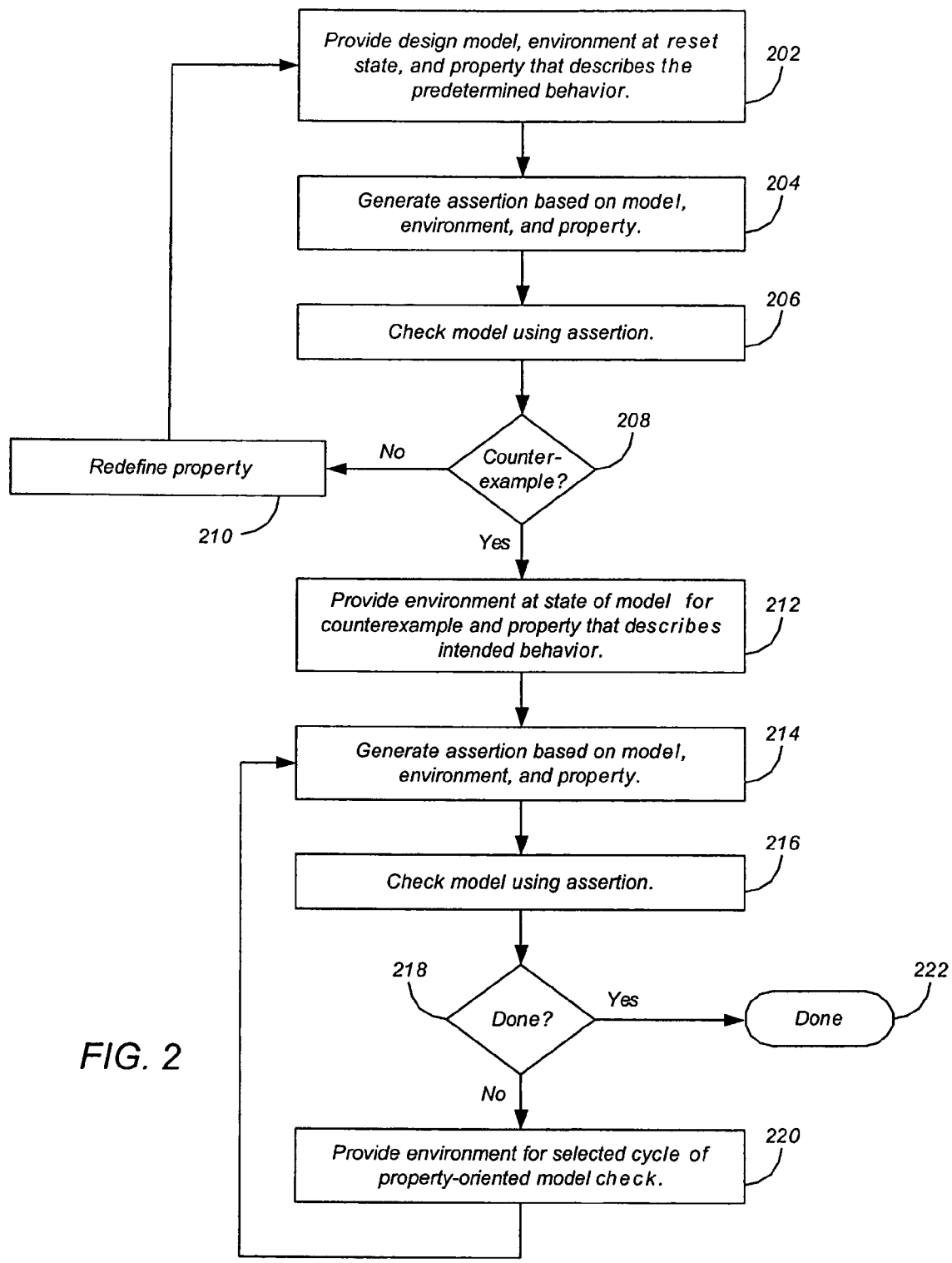
FIG. 2 shows a process that is performed by the model checker of FIGS. 1A, 1B, and 1C according to a preferred embodiment of the present invention.

FIG. 2 shows a process 200 that is performed by model checker 100 of FIGS. 1A, 1B, and 1C according to a preferred embodiment of the present invention. In particular, process 200 uses model checker 100 first to locate a predetermined behavior (referred to herein as the "event-oriented model check"), and then to check the model 102 beginning with the occurrence of that predetermined behavior (referred to herein as the "property-oriented model check"). For example, where the predetermined behavior is "buffer full," process 200 first uses model checker 100 to find an example of "buffer full," and then uses model checker 100 a second time to begin model checking with that occurrence of "buffer full" to see what happens next.

This process is referred to herein as "extended model checking," as model checker 100 is used to check beyond its conventional limit. When model checker 100 is a bounded model checker that will be beyond the cycle limit. For example, if the cycle limit for a bounded model checking is 30 cycles, and no example of "buffer full" occurs until cycle 30, a conventional bounded model checker would be unable to check the design for what happens after "buffer full." But by extending model checking to begin with "buffer full," embodiments of the present invention can see what behavior occurs after "buffer full". This can happen since typically for an event-oriented property such as "buffer never fills" a model checker will be able to find results beyond the 30 cycles limit that apply to the spec-oriented property.

Referring again to FIG. 2, process 200 provides a model 102 of the design, an environment 104A of the design at the reset state, and a property 106A for the design that describes the predetermined behavior (step 202). For example, property 106A describes "buffer not full." Typically property 106A can be checked for a larger k meaning the predetermined behavior is searched for during more cycles. This is true since typically property 106A involves less logic than a spec-oriented property.

Model checker 100 generates a formula 108A based on model 102, environment 104A, and property 106A (step 204). In a preferred embodiment of the present invention, model checker 100 generates formula 108A by providing a Boolean expression that comprises a plurality of Boolean variables and represents a statement that the predetermined behavior does not occur. For the present example, formula 108A would state that the buffer never fills.

Engine 110 checks model 102 using formula 108A until an example of the predetermined behavior occurs or until it is determined that no such example exists. Other possible outcomes can be that "non-reasonable" time has passed and the model checker has not reached a resolution or that the check failed due to memory limits (step 206). In a preferred embodiment, engine 110 comprises a Boolean satisfiability (SAT) engine. The SAT engine checks model 102 by determining whether there is an assignment of values to the Boolean variables of the formula that renders the formula false. Each such assignment constitutes a "counterexample." If the model checker run stops normally and no counterexample is found, formula 108A is declared passed. In the case of a SAT engine it is declared unsatisfied, meaning that the design complies with the behavior described by the property 106A from which the formula 108A was derived. For the present example, this means that the buffer never fills. For a bounded model checker, this means the buffer never fills until some predetermined cycle. It could also be that the model checker run does not stop in a reasonable time or fails due to a memory limit. In such a case it is unknown if the buffer fills or not. However, for our purpose this is the same as if the buffer never fills until cycle k since we do not have a counterexample.

Any counterexample found at step 206 represents an example of the occurrence of a behavior other than the behavior described by property 106A. If no counterexample is found at step 206, no example of the predetermined behavior was found (step 208).

Property 106A can be redefined (step 210). For example, redefined property 106A can describe "buffer is never full minus one". Then steps 202, 204, and 206 are repeated. If a counterexample is now found (step 208), new steps can be applied searching for original property 106A, this time starting from the state of model 102 for the example of the predetermined behavior, for the present example, searching for "buffer flull" starting from "buffer full minus one."

But if at step 206 a counterexample is found (step 208), meaning an example of the predetermined behavior was found, process 200 captures the state of model 102 for the example of the predetermined behavior, and checks model 102 again, this time starting from the state of model 102 for the example of the predetermined behavior, and using a property that describes a desired behavior of the design, such as properties derived from the specification for the design. The ability to capture the state of model 102 is provided by conventional model checkers. Let Ka represent the cycle in which the counterexample occurs. In the present example, Ka is the cycle in which the buffer fills.

Referring to FIG. 1B, process 200 provides an environment 104B of the design at the state of model 102 for the example of the predetermined behavior and a property 106B for the design that describes one or more intended behaviors of the design (step 212). For example, property 106B can be derived from the design specification. Property 106B is preferably provided in a language such as Property Specification Language (PSL), Sugar, or the like.

In some embodiments process 200 provides environment 104B by providing the values of the Boolean variables in formula 108A for each of the first Ka cycles of the event-oriented model check. In other embodiments process 200 provides environment 104B by providing the values of the Boolean variables in formula 108A for the cycle of the event-oriented model check at which the example of the predetermined behavior occurred (i.e. Ka). The capacity to provide the values of the Boolean variables and the state of model 102 are provided as functions of conventional model checkers.

Model checker 100 generates formula 108B based on model 102, environment 104B, and property 106B (step 214). Engine 110 checks model 102 using formula 108B (step 216). In this way the behavior of model 102 in the cycles following the example of the predetermined behavior can be formally verified. When model checker 100 is a bounded model checker this means reaching cycles that could not be reached if property 106B was checked without steps 202, 204, 206. If no further model checking is desired (step 218), then process 200 is done (step 222).

If desired, further property-oriented model checks can be performed based on the property-oriented model check of step 214, for example, to explore further beyond the cycle limit of model checker 100. Referring to FIG. 1C, process 200 provides an environment 104C of the design at the state of model 102 for a selected cycle of the property-oriented model check of step 214 and property 106B for the design that describes one or more intended behaviors of the design (step 220). Of course, a property other than property 106B could be used. Model checker 100 generates a formula 108C based on model 102, environment 104B, and property 106C (step 214). Engine 110 checks model 102 using formula 108C (step 216). This process can be repeated as many times as desired.

Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks.

A number of implementations of the invention have been described. Nevertheless, it will be understood that various modifications may be made without departing from the spirit and scope of the invention. Accordingly, other implementations are within the scope of the following claims.

What is claimed is:

1. A method for verifying a design of a circuit, comprising:
   providing a model of the design;
   providing a first property for the design, wherein the first property describes a first behavior;
   checking the model using the first property and an environment of the design at a reset state until an example of the first behavior occurs;
   providing a second property for the design, wherein the second property describes a second behavior; and
   checking the model using the second property and an environment of the design at a state when the example of the first behavior occurs.

2. The method of claim 1, wherein providing the first property comprises:
   providing a Boolean expression representing a formula that the first behavior does not occur, wherein the Boolean expression comprises a plurality of Boolean variables.

3. The method of claim 2, wherein checking the model using the first property comprises:
   determining a set of values for the Boolean variables of the Boolean expression that causes the Boolean expression to be false.

4. The method of claim 1, further comprising:
   providing the environment of the design at the reset state.

5. The method of claim 1, further comprising:
   providing the environment of the design at the state when the example of the first behavior occurs.

6. The method of claim 5, wherein providing the environment of the design at the state when the example of the first behavior occurs comprises at least one of the group consisting of
   describing the state when the example of the first behavior occurs; and providing the values of the Boolean variables of the Boolean expression.

7. An electronic circuit verified by the method of claim 1.

8. A computer program stored on a computer-readable medium for use by a processor for verifying a design of a circuit, comprising:
   providing a model of the design;
   providing a first property for the design, wherein the first property describes a first behavior;
   checking the model using the first property and an environment of the design at a reset state until an example of the first behavior occurs;
   providing a second property for the design, wherein the second property describes a second behavior; and
   checking the model using the second property and an environment of the design at a state when the example of the first behavior occurs.

9. The computer program of claim 8, wherein providing the first property comprises:
   providing a Boolean expression representing a formula that the first behavior does not occur, wherein the Boolean expression comprises a plurality of Boolean variables.

10. The computer program of claim 9, wherein checking the model using the first property comprises:
    determining a set of values for the Boolean variables of the Boolean expression that causes the Boolean expression to be false.

11. The computer program of claim 8, further comprising: providing the environment of the design at the reset state.

12. The computer program of claim 8, further comprising:
    providing the environment of the design at the state when the example of the first behavior occurs.

13. The computer program of claim 12, wherein providing the environment of the design at the state when the example of the first behavior occurs comprises at least one of the group consisting of
    describing the state when the example of the first behavior occurs; and providing the values of the Boolean variables of the Boolean expression.

14. An electronic circuit verified by the computer program of claim 8.

* * * * *

UNITED STATES PATENT AND TRADEMARK OFFICE
CERTIFICATE OF CORRECTION

| | |
|---|---|
| PATENT NO. | : 7,231,619 B1 |
| APPLICATION NO. | : 10/790688 |
| DATED | : June 12, 2007 |
| INVENTOR(S) | : Nimrod Agmon |

It is certified that error appears in the above-identified patent and that said Letters Patent is hereby corrected as shown below:

Column 4, Line 28    Delete "flull" and insert -- full -- (first occurrence)

Signed and Sealed this

Sixth Day of May, 2008

JON W. DUDAS
*Director of the United States Patent and Trademark Office*